(12) United States Patent
Mukai (10) Patent No.: US 11,631,515 B2
(45) Date of Patent: Apr. 18, 2023

(54) FILTER DEVICE AND MULTIPLEXER

(71) Applicant: Murata Manufacturing Co., Ltd., Nagaokakyo (JP)

(72) Inventor: Takao Mukai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1155 days.

(21) Appl. No.: 16/224,953

(22) Filed: Dec. 19, 2018

(65) Prior Publication Data

US 2019/0131051 A1 May 2, 2019

Related U.S. Application Data

(63) Continuation of application No. PCT/JP2017/020134, filed on May 30, 2017.

(30) Foreign Application Priority Data

Jun. 27, 2016 (JP) .............................. JP2016-126850

(51) Int. Cl.
*H01F 17/00* (2006.01)
*H03H 9/05* (2006.01)
(Continued)

(52) U.S. Cl.
CPC ....... *H01F 17/0013* (2013.01); *H01F 27/292* (2013.01); *H03H 7/1766* (2013.01); (Continued)

(58) Field of Classification Search
CPC . H01F 17/0013; H01F 27/292; H03H 7/1766; H03H 9/0004; H03H 9/0542;
(Continued)

(56) References Cited

U.S. PATENT DOCUMENTS

2012/0274416 A1* 11/2012 Hara ...................... H03H 9/725
333/195
2015/0091669 A1 4/2015 Mizoguchi

FOREIGN PATENT DOCUMENTS

JP 2006-279604 A 10/2006
JP 2015-089097 A 5/2015
(Continued)

OTHER PUBLICATIONS

Official Communication issued in International Patent Application No. PCT/JP2017/020134, dated Aug. 1, 2017.

*Primary Examiner* — Hafizur Rahman
*Assistant Examiner* — Kimberly E Glenn
(74) *Attorney, Agent, or Firm* — Keating & Bennett, LLP (57) ABSTRACT

A filter device includes a first filter including series resonators and parallel resonators, a first inductor connected in parallel between a first terminal and the first filter, a second inductor provided in series between the first filter and a second terminal, and a third inductor provided in series in a channel connecting the parallel resonator and ground, the third inductor is incorporated in a multilayer substrate, the first filter is mounted on a main surface of the multilayer substrate and incorporated in a filter chip, and the first inductor and the second inductor are chip inductors including coil conductors and are mounted on the main surface of the multilayer substrate beside the filter chip so as to be adjacent to each other and such that coil axes thereof are orthogonal or substantially orthogonal to each other.

17 Claims, 5 Drawing Sheets

(51) Int. Cl.
    *H03H 9/64*       (2006.01)
    *H01F 27/29*     (2006.01)
    *H03H 7/01*       (2006.01)
    *H03H 9/00*       (2006.01)
    *H03H 9/72*       (2006.01)

(52) U.S. Cl.
    CPC ........ *H03H 9/0004* (2013.01); *H03H 9/0542* (2013.01); *H03H 9/0557* (2013.01); *H03H 9/0566* (2013.01); *H03H 9/6483* (2013.01); *H03H 9/725* (2013.01)

(58) Field of Classification Search
    CPC .. H03H 9/0557; H03H 9/0566; H03H 9/6483; H03H 9/725
    See application file for complete search history.

(56) References Cited

FOREIGN PATENT DOCUMENTS

| | | |
|---|---|---|
| WO | 2012/176576 A1 | 12/2012 |
| WO | 2015/098240 A1 | 7/2015 |

\* cited by examiner

FILTER DEVICE AND MULTIPLEXER

CROSS REFERENCE TO RELATED APPLICATIONS

This application claims the benefit of priority to Japanese Patent Application No. 2016-126850 filed on Jun. 27, 2016 and is a Continuation Application of PCT Application No. PCT/JP2017/020134 filed on May 30, 2017. The entire contents of each application are hereby incorporated herein by reference.

BACKGROUND OF THE INVENTION

1. Field of the Invention

The present invention relates to a filter device including a ladder filter and an inductor, and a multiplexer including a filter device.

2. Description of the Related Art

Recently, a cellular phone has been required to accommodate, by one terminal, a plurality of frequency bands and a plurality of wireless systems which are multi-band and multi-mode. To cope with this, a multiplexer which divides high frequency signals having a plurality of radio carrier frequencies is arranged under one antenna. As a filter device defining the multiplexer, it is necessary to improve attenuation characteristics of a single filter.

An example of such a filter device is disclosed in International Publication No. WO 2015/098240. The filter device includes a rectangular substrate, a rectangular parallelepiped filter chip mounted on the substrate, and three chip inductors mounted on the substrate. In this filter device, two chips of the three chip inductors are respectively arranged in the vicinity of different side surfaces of the filter chip. The degree of coupling between the inductors is adjusted by changing a distance between the two chip inductors and the directions of the chip inductors, thus improving the attenuation characteristics of the filter device.

However, in the filter device disclosed in International Publication No. WO 2015/098240, since the two chip inductors are respectively arranged in the vicinity of the different side surfaces of the filter chip, the area of the rectangular substrate becomes large, and it is difficult to reduce the size of the filter device.

SUMMARY OF THE INVENTION

Preferred embodiments of the present invention improve attenuation characteristics of filter devices and enable a reduction in the size of the filter devices.

A filter device according to a preferred embodiment of the present invention includes a first terminal and a second terminal, a ladder first filter which is provided in a first channel connecting the first terminal and the second terminal and includes a series resonator and a parallel resonator, a first inductor which is connected in parallel to the first channel between the first terminal and the first filter, a second inductor which is provided in series in the first channel between the first filter and the second terminal, and a third inductor which is provided in series in a channel connecting the parallel resonator and ground, wherein the third inductor is incorporated in a multilayer substrate which is a multilayer body of a plurality of base members, the first filter is mounted on a main surface of the multilayer substrate in a state of being incorporated in a filter chip as a chip filter element, and the first inductor and the second inductor respectively are chip inductors including coil conductors and are mounted on the main surface of the multilayer substrate beside the filter chip so as to be adjacent to each other and coil axes of the first inductor and the second inductor are orthogonal or substantially orthogonal to each other.

As described above, the first inductor and the second inductor are respectively arranged beside the filter chip so as to be adjacent to each other, and the third inductor is incorporated in the multilayer substrate, so that the filter device is able to be reduced in size. Further, the first inductor and the second inductor are not inductively coupled to each other because the coil axis of the first inductor and the coil axis of the second inductor are orthogonal or substantially orthogonal to each other. Thus, attenuation characteristics outside a pass band of the filter device are able to be improved. Further, when a multiplexer including the filter device is provided, isolation from another filter is able to be ensured.

Further, the first inductor and the second inductor may be mounted on the multilayer substrate such that either one of the coil axes is orthogonal or substantially orthogonal to the main surface of the multilayer substrate, and the third inductor may be a coil conductor pattern incorporated in the multilayer substrate such that a coil axis of the third inductor is orthogonal or substantially orthogonal to the main surface of the multilayer substrate.

With this configuration, the coil axis of the third inductor is parallel or substantially parallel to the coil axis of the first inductor or the coil axis of the second inductor, and the third inductor and the first inductor or the second inductor are inductively coupled to each other. Thus, it is possible to improve the attenuation characteristics of the filter device.

In addition, a coupling coefficient between either the first inductor and the third inductor and the second inductor and the third inductor may be equal to or greater than about 0.006 and equal to or less than about 0.042.

Accordingly, the coupling coefficient of the first inductor or the second inductor and the third inductor is able to be appropriately set, and the attenuation characteristics of the filter device are able to be improved.

Further, the first filter may include a parallel resonator different from the parallel resonator connected to the third inductor, a fourth inductor which is provided in series in a channel connecting the parallel resonator different from the parallel resonator connected to the third inductor and ground may be provided, and the fourth inductor may be incorporated in the multilayer substrate As described above, it is possible to reduce the size of the filter device by incorporating the fourth inductor in the multilayer substrate. Further, a pass band width of the first filter is able to be increased by the fourth inductor.

Further, the first inductor and the second inductor may be mounted on the multilayer substrate such that either of the coil axes are orthogonal or substantially orthogonal to the main surface of the multilayer substrate, and the fourth inductor may be a coil conductor pattern incorporated in the multilayer substrate such that a coil axis of the fourth inductor is orthogonal or substantially orthogonal to the main surface of the multilayer substrate.

With this configuration, the coil axis of the fourth inductor is parallel or substantially parallel to the coil axis of the first inductor or the coil axis of the second inductor, and the fourth inductor and the first inductor or the second inductor are inductively coupled to each other. Thus, it is possible to improve the attenuation characteristics of the filter device.

In addition, a coupling coefficient between one of the first inductor or the second inductor and the fourth inductor may be equal to or greater than about 0.006 and equal to or less than about 0.042.

Accordingly, the coupling coefficient of the first inductor or the second inductor and the fourth inductor is able to be appropriately set, and the attenuation characteristics of the filter device are able to be improved.

Further, a multiplexer according to a preferred embodiment of the present invention includes the filter device, a third terminal, and a second filter provided on a second channel connecting the first terminal and the third terminal.

With this configuration, it is possible to reduce the size of the multiplexer while ensuring isolation between the first filter in the multiplexer and the second filter defining the multiplexer.

According to preferred embodiments of the present invention, it is possible to improve the attenuation characteristics of the filter devices and to reduce the size of the filter devices. Further, when multiplexers including the filter devices are provided, isolation from another filter is able to be ensured.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described in detail with reference to the drawings. It should be noted that each of the preferred embodiments, which will be described below, represents a comprehensive or specific example. Numerical values, shapes, materials, components, arrangement and connection configurations of the components, and other aspects and features, which will be described in the following preferred embodiments, are merely examples and are not intended to limit the present invention. The components in the following preferred embodiments that are not described in independent claims will be described as optional components. Also, sizes or ratios of the sizes of the components illustrated in the drawings are not necessarily precise.

First Preferred Embodiment

A multiplexer and a filter device according to a first preferred embodiment of the present invention are preferably used in a communication apparatus, such as a cellular phone, for example. In the present preferred embodiment, a duplexer preferably having Band 28A (transmission passband: about 703 MHz to about 733 MHz, reception passband: about 758 MHz to about 788 MHz) as a multiplexer will be described, as an example.

Figure 1:
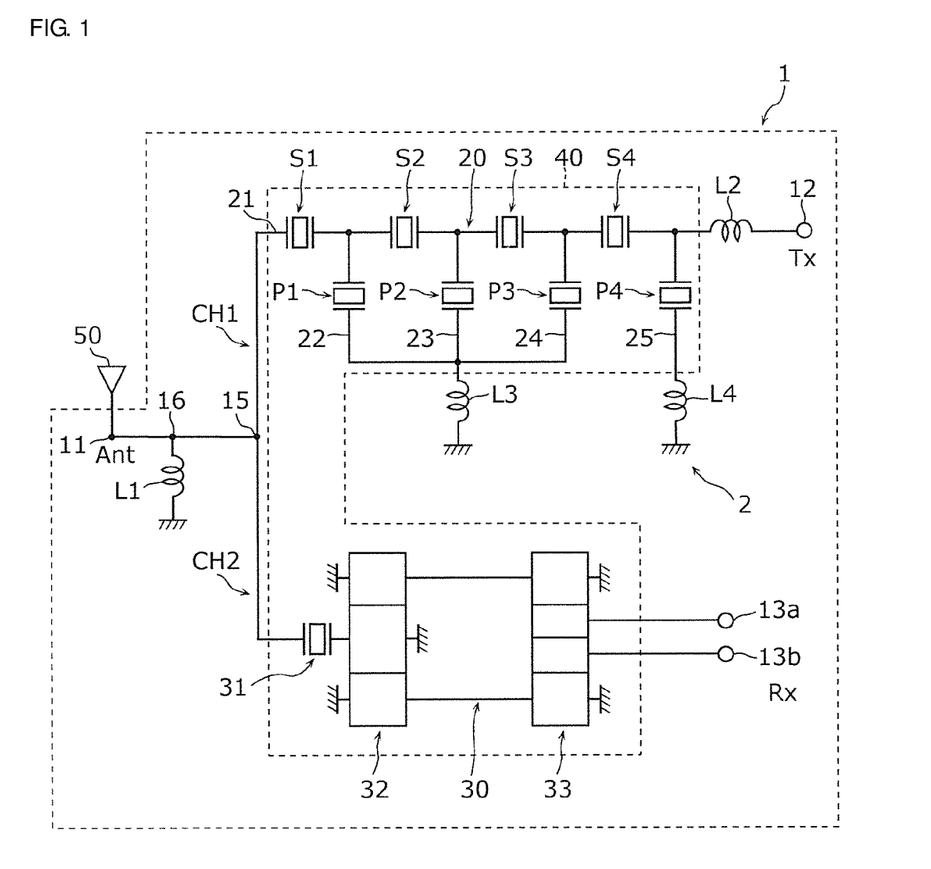
FIG. 1 is a circuit configuration diagram of a multiplexer and a filter device according to a first preferred embodiment of the present invention.

FIG. 1 is a circuit configuration diagram of a multiplexer 1 and a filter device 2 according to the first preferred embodiment.

The multiplexer 1 includes a first terminal 11 which is an antenna-side terminal, a second terminal 12 which is a transmission-side signal terminal, third terminals 13a and 13b which are reception-side signal terminals, a first filter 20 which is a transmission filter, and a second filter 30 which is a reception filter. The first terminal 11 is connected to an antenna 50.

The filter device 2 defining the multiplexer 1 includes the first terminal 11, the second terminal 12, and the first filter 20. The filter device 2 further includes a first inductor L1, a second inductor L2, a third inductor L3, and a fourth inductor L4.

The first filter 20 is provided on a first channel CH1 connecting the first terminal 11 and the second terminal 12, and the second filter 30 is provided on a second channel CH2 connecting the first terminal 11 and the third terminals 13a and 13b. The first channel CH1 and the second channel CH2 are commonly connected at a connection point 15.

The first filter 20 is an unbalanced filter that outputs an unbalanced signal to the first terminal 11. Specifically, the first filter 20 is preferably defined by a ladder filter, for example.

The first filter 20 includes series resonators S1, S2, S3, and S4. Each of the series resonators S1 to S4 is serially provided in a series arm 21 provided on the first channel CH1 between the connection point 15 and the second terminal 12.

Further, the first filter 20 includes parallel resonators P1, P2, P3, and P4. The parallel resonator P1 is provided in a parallel arm 22 connected to the series arm 21 between the series resonators S1 and S2. The parallel resonator P2 is provided in a parallel arm 23 connected to the series arm 21 between the series resonators S2 and S3. The parallel resonator P3 is provided in a parallel arm 24 connected to the series arm 21 between the series resonators S3 and S4. The parallel resonator P4 is provided in a parallel arm 25 connected to the series arm 21 between the series resonator S4 and the second inductor L2 which will be described later.

The series resonators S1 to S4 and the parallel resonators P1 to P4 defining the first filter 20 are preferably elastic wave resonators, for example.

The first inductor L1 is connected in parallel to the first channel CH1 between the first terminal 11 and the first filter 20. Specifically, the first inductor L1 is provided between a connection point 16 located between the connection point 15 and the first terminal 11 and the ground. The second inductor L2 is serially provided in the first channel CH1 between the first filter 20 and the second terminal 12. Each of the first inductor L1 and the second inductor L2 is an impedance matching inductor.

The third inductor L3 is a common inductor to the parallel resonators P1 to P3 and is provided in series in a channel connecting the parallel resonators P1 to P3 and the ground. The third inductor L3 is an inductor to increase attenuation in a high frequency range by providing an attenuation pole at a desired frequency.

The fourth inductor L4 is provided in series in a channel connecting the parallel resonator P4 and the ground. In other words, the fourth inductor L4 is connected to the parallel resonator P4 which is different from the parallel resonators P1 to P3 connected to the third inductor L3. The fourth inductor L4 is an inductor to increase the pass band width of the first filter 20.

The second filter 30 of the multiplexer 1 is a balanced filter which outputs a balanced signal to the third terminals 13a and 13b. Specifically, the second filter 30 preferably includes an elastic wave resonator 31 and longitudinally coupled resonator elastic wave filter portions 32 and 33, for example. The longitudinally coupled resonator elastic wave filter portions 32 and 33 are cascade connected with each other and have a balanced-unbalanced transforming function. It should be noted that the second filter 30 may be an unbalanced filter which outputs an unbalanced signal to the third terminals. For example, the second filter 30 may preferably be defined by a ladder filter.

Next, the structure of the filter device 2 will be described.

Figure 2A:
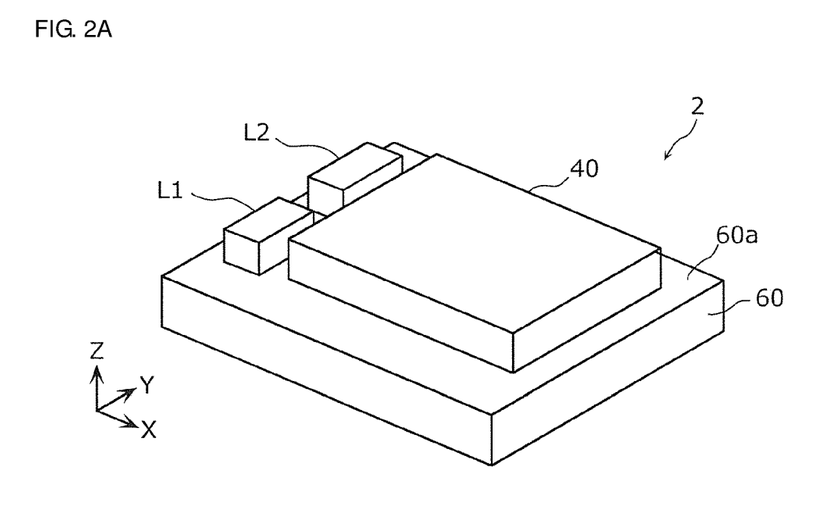
FIG. 2A is a perspective view of the filter device according to the first preferred embodiment of the present invention.
Figure 2B:
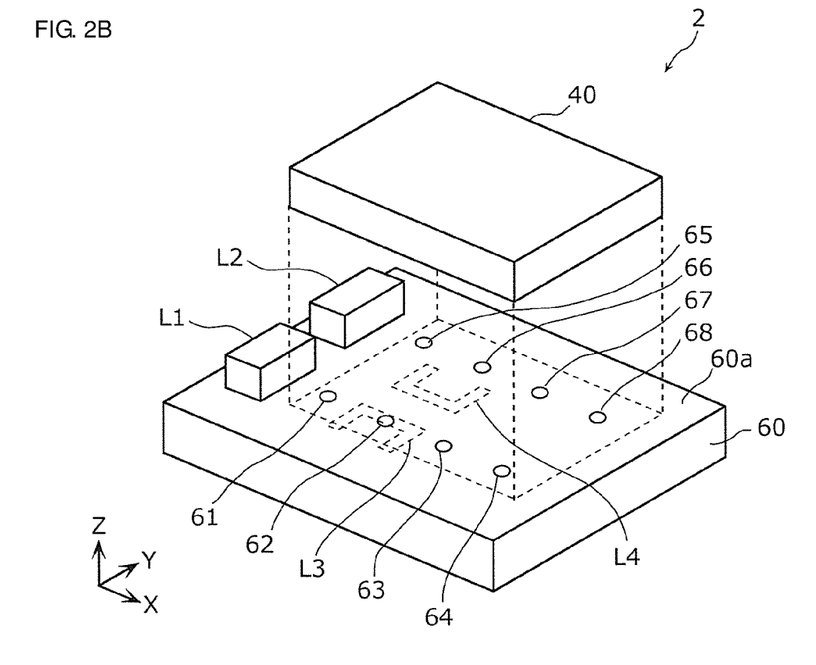
FIG. 2B is a perspective view in which a portion of the filter device according to the first preferred embodiment of the present invention is exploded.
Figure 3:
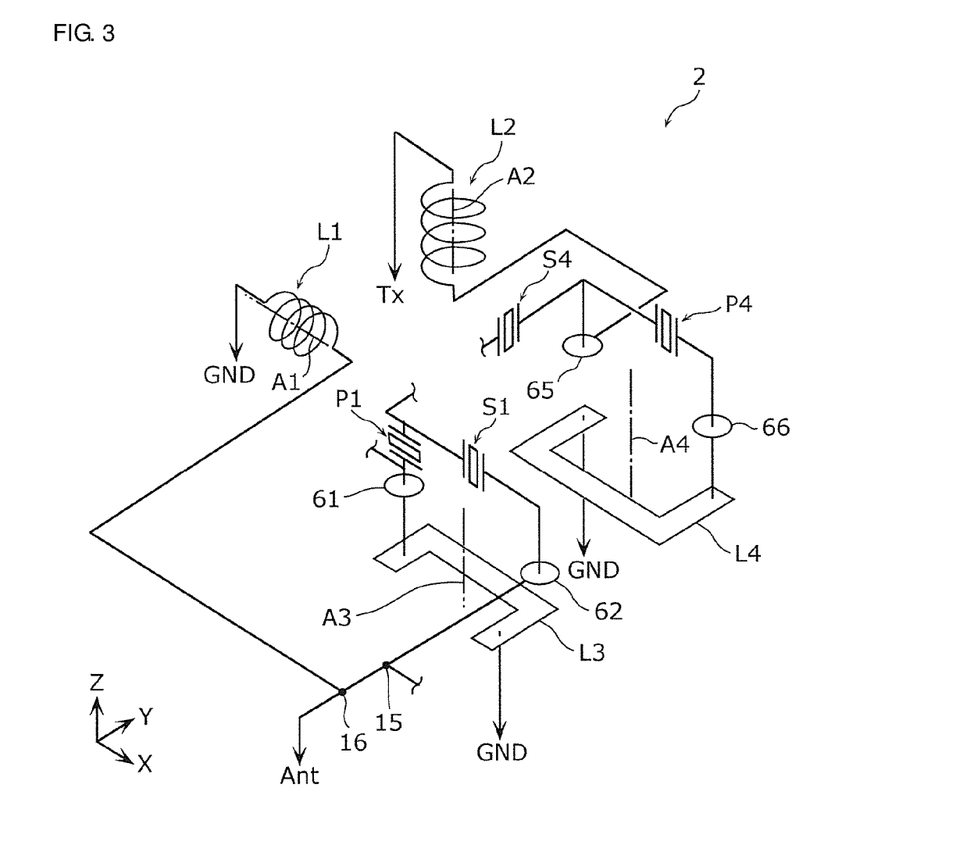
FIG. 3 is a diagram schematically illustrating a portion of a circuit of the filter device according to the first preferred embodiment of the present invention.

FIG. 2A is a perspective view of the filter device 2. FIG. 2B is a perspective view in which a portion of the filter device 2 is exploded. FIG. 3 is a diagram schematically illustrating a portion of a circuit of the filter device 2.

As illustrated in FIG. 2A, the filter device 2 includes a multilayer substrate 60, a filter chip 40 mounted on a main surface 60a of the multilayer substrate 60, and the first inductor L1 and the second inductor L2. Further, as illustrated in FIG. 2B, the filter device 2 includes the third inductor L3 and the fourth inductor L4 incorporated in the multilayer substrate 60.

The multilayer substrate 60 preferably has a rectangular or substantially rectangular shape when viewed in a plan view. The multilayer substrate 60 is preferably a multilayer body including a plurality of ceramic base layers or a multilayer body including a plurality of resin-containing base layers. In the present preferred embodiment, the multilayer substrate 60 includes preferably six to twelve of the ceramic base layers, for example. A conductor wiring preferably made of a metal foil of Cu or other suitable materials, for example, is provided on the main surface 60a of the multilayer substrate 60 (not illustrated in the drawing). This conductor wiring electrically connects the filter chip 40, the first inductor L1, and the second inductor L2.

The filter chip 40 is preferably a chip filter element having a rectangular or substantially rectangular parallelepiped shape. The filter chip 40 is preferably a WLP (Wafer Level Package) elastic wave device, for example, and incorporates therein the first filter 20. In the present preferred embodiment, the second filter 30 is also incorporated in the filter chip 40.

The filter chip 40 is connected to eight lands 61 to 68 provided on the main surface 60a of the multilayer substrate 60 with solder bumps interposed therebetween. Of the eight lands 61 to 68, for example, the land 62 is connected to the first terminal 11, the land 65 is connected to the second terminal 12 with the second inductor L2 interposed therebetween, the land 68 is connected to the third terminals 13a and 13b, and the remaining lands 61, 63, 64, 66 and 67 are connected to the ground.

Each of the first inductor L1 and the second inductor L2 is preferably a chip inductor including a coil conductor, and is, for example, a multilayer inductor in which a plurality of coil patterns are connected by a via. Each of the first inductor L1 and the second inductor L2 is connected to the conductor wiring on the main surface 60a of the multilayer substrate 60 with solder or other suitable connection structure interposed therebetween. It is preferable that the first inductor L1 and the second inductor L2 have the same or substantially the same electrical characteristics (inductance value, and other characteristics). Note that as the first inductor L1 and the second inductor L2, a winding inductor in which a wire is wound may be used.

The first inductor L1 and the second inductor L2 are respectively provided beside the filter chip 40 so as to be adjacent to each other. Specifically, the first inductor L1 and the second inductor L2 preferably having rectangular or substantially rectangular parallelepiped shapes are respectively disposed in the vicinity of one side surface of the filter chip 40 along a Y-axis direction when the multilayer substrate 60 is viewed in a plan view.

Further, the first inductor L1 and the second inductor L2 are disposed such that coil axes A1 and A2 thereof are orthogonal or substantially orthogonal to each other. In the present preferred embodiment, as illustrated in FIG. 3, the second inductor L2 is disposed such that the coil axis A2 thereof is orthogonal or substantially orthogonal to the main surface 60a of the multilayer substrate 60. The first inductor L1 is disposed such that the coil axis A1 thereof is parallel or substantially parallel to the main surface 60a of the multilayer substrate 60, and specifically, such that the coil axis A1 is parallel or substantially parallel to an X axis. With this structure, the first inductor L1 and the second inductor L2 are not inductively coupled to each other.

The third inductor L3 is preferably a coil conductor pattern with about ¾ turns, for example. The third inductor L3 is provided in the multilayer substrate 60 such that a coil axis A3 thereof is orthogonal or substantially orthogonal to the main surface 60a of the multilayer substrate 60, i.e., such that the coil axis A3 is parallel or substantially parallel to the coil axis A2. With this configuration, the third inductor L3 is not inductively coupled to the first inductor L1 and is inductively coupled to the second inductor L2.

The fourth inductor L4 is preferably a coil conductor pattern with about ¾ turns, for example. The fourth inductor L4 is provided in the multilayer substrate 60 such that a coil axis A4 thereof is orthogonal or substantially orthogonal to the main surface 60a of the multilayer substrate 60, i.e., such that the coil axis A4 is parallel or substantially parallel to the coil axis A2. With this configuration, the fourth inductor L4 is not inductively coupled to the first inductor L1 and is inductively coupled to the second inductor L2.

As a material of the third inductor L3 and the fourth inductor L4, for example, metal or an alloy including silver as a main component is preferably used. The third inductor L3 and the fourth inductor L4 are provided on the same ceramic base layer. However, they may be provided on different ceramic base layers.

In the filter device 2 according to the present preferred embodiment, the coil axis A1 of the first inductor L1 and the coil axis A2 of the second inductor L2 are orthogonal or substantially orthogonal to each other so as to prevent the first inductor L1 and the second inductor L2 from being inductively coupled to each other. Thus, unnecessary magnetic field coupling between the inductors L1 and L2 is able to be reduced or eliminated, and deterioration in the attenuation characteristics is able to be reduced or prevented.

Further, in the filter device 2, the first inductor L1 and the second inductor L2 are respectively provided beside the filter chip 40 so as to be adjacent to each other, and the third inductor L3 is incorporated in the multilayer substrate 60. With these configurations, it is possible to reduce the size of the filter device 2.

In addition, in the filter device 2, the coil axis A3 of the third inductor L3 or the coil axis A4 of the fourth inductor L4 is parallel or substantially parallel to the coil axis A2 of the second inductor L2, and the third inductor L3 or the fourth inductor L4 and the second inductor L2 are inductively coupled to each other. Thus, it is possible to cancel unnecessary waves that have passed through the first filter 20 by using an inverted signal of the unnecessary waves, the inverted signal being generated by the inductive coupling, thus improving the attenuation characteristics of the filter device 2.

Hereinafter, an evaluation result (simulation result) of the multiplexer 1 including the filter device 2 according to the first preferred embodiment will be described.

Figure 4:
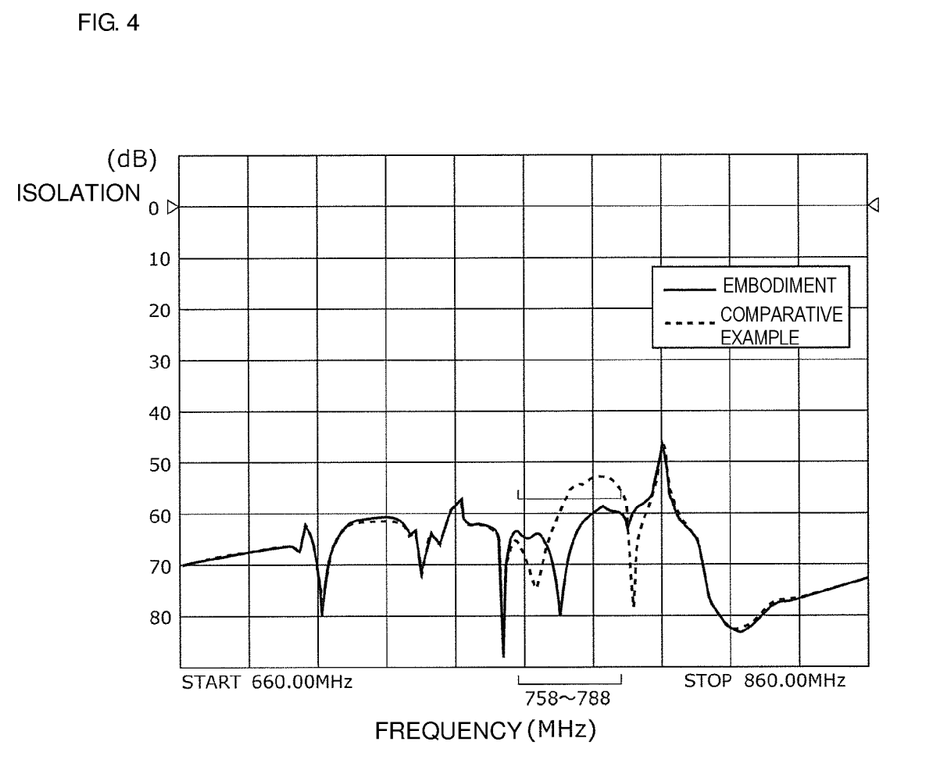
FIG. 4 is a diagram illustrating isolation characteristics of multiplexers according to the first preferred embodiment of the present invention and a comparative example.

FIG. 4 is a diagram illustrating isolation characteristics of multiplexers according to the first preferred embodiment and a comparative example.

An evaluation circuit of the multiplexer 1 including the filter device 2 corresponding to the first preferred embodiment was a circuit, as illustrated in FIG. 1 and FIG. 3, in which the first inductor L1 and the second inductor L2 having the same or substantially the same electrical characteristics were disposed adjacent to each other such that the coil axes A1 and A2 thereof were orthogonal or substantially orthogonal to each other.

On the other hand, an evaluation circuit of the multiplexer including a filter device corresponding to the comparative example was a circuit in which the second inductor L2 illustrated in FIG. 3 was rotated by about 90° and the first inductor L1 and the second inductor L2 were disposed such that the coil axes thereof were parallel or substantially parallel to each other.

In performing the evaluation, it was determined whether or not isolation was good using, as a reference value, about 57.5 dB which is generally required as isolation in an Rx band (reception pass band) of Band 28A. Note that the coupling coefficient between the second inductor L2 and the third inductor L3 was set to be about 0.025, for example.

As illustrated in FIG. 4, in the multiplexer of the comparative example, there is a portion at which the isolation is lowered in a band of equal to or higher than about 758 MHz and equal to or lower than about 788 MHz as the reception pass band of Band 28A. On the other hand, in the multiplexer 1 of the first preferred embodiment, it is possible to exceed about 57.5 dB in the same band and ensure the isolation.

That is to say, as in the present preferred embodiment, in order to reduce the size of the multiplexer 1, even when the first inductor L1 and the second inductor L2 are disposed adjacent to each other, the isolation in the Rx band of the multiplexer 1 is able to be ensured by disposing them such that the coil axes A1 and A2 thereof are orthogonal or substantially orthogonal to each other.

Figure 5:
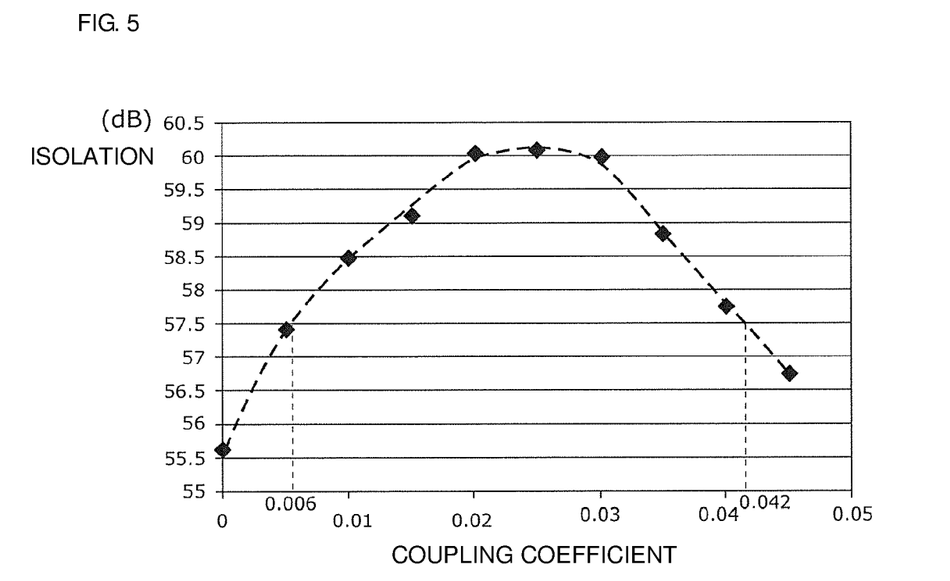
FIG. 5 is a diagram illustrating a relationship between a coupling coefficient between a second inductor and a third inductor, and isolation in the first preferred embodiment of the present invention.

Next, a relationship between the coupling coefficient of the inductors and the isolation in the filter unit 2 of the multiplexer 1 will be described. FIG. 5 is a diagram illustrating the relationship between the coupling coefficient between the second inductor L2 and the third inductor L3, and the isolation.

As illustrated in FIG. 5, it was discovered that in the filter device 2, when the coupling coefficient between the second inductor L2 and the third inductor L3 is equal to or greater than about 0.006 and equal to or less than about 0.042, for example, the isolation in the Rx band of Band 28A exceeds about 57.5 dB. From this result, it is understood that in order to obtain good isolation in the multiplexer 1, the coupling coefficient between the second inductor L2 and the third inductor L3 of the filter device 2 is preferably set to be equal to or greater than about 0.006 and equal to or less than about 0.042, for example.

Note that the above-described relationship is the same or substantially the same as a relationship between the second inductor L2 and the fourth inductor L4. In other words, in order to obtain good isolation in the multiplexer 1, the coupling coefficient between the second inductor L2 and the fourth inductor L4 of the filter device 2 is preferably set to be equal to or greater than about 0.006 and equal to or less than about 0.042, for example.

Second Preferred Embodiment

Figure 6:
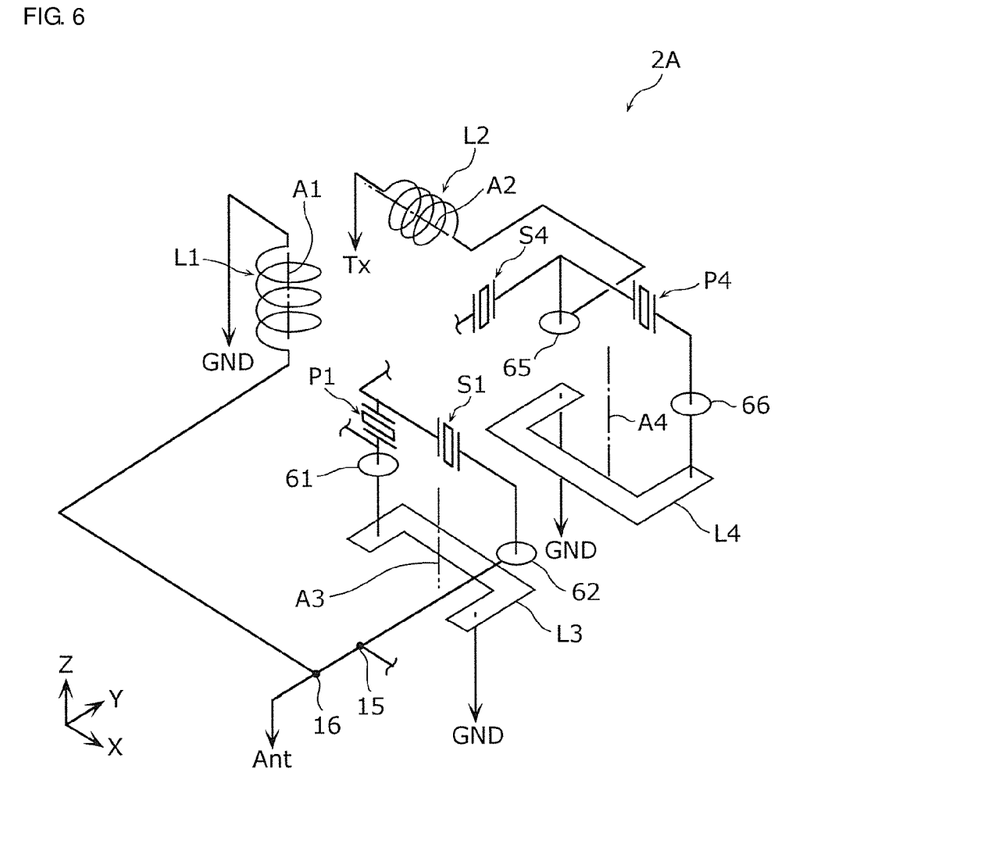
FIG. 6 is a diagram schematically illustrating a portion of a circuit of a filter device according to a second preferred embodiment of the present invention.

FIG. 6 is a diagram schematically illustrating a portion of a circuit of a filter device 2A according to a second preferred embodiment of the present invention.

In the filter device 2A according to the second preferred embodiment, the directions of the coil axes of the first inductor L1 and the second inductor L2 are opposite to those in the filter device 2 according to the first preferred embodiment.

In the second preferred embodiment, as illustrated in FIG. 6, the first inductor L1 is disposed such that the coil axis A1 thereof is orthogonal or substantially orthogonal to the main surface 60a of the multilayer substrate 60. The second inductor L2 is disposed such that the coil axis A2 thereof is parallel or substantially parallel to the main surface 60a of the multilayer substrate 60, and specifically, such that the coil axis A2 is parallel or substantially parallel to the X axis. With this arrangement, the first inductor L1 and the second inductor L2 have a configuration not inductively coupled to each other. Further, the third inductor L3 is not inductively coupled to the second inductor L2 and is inductively coupled to the first inductor L1. The fourth inductor L4 is not inductively coupled to the second inductor L2 and is inductively coupled to the first inductor L1.

In the filter device 2A according to the present preferred embodiment, the coil axis A1 of the first inductor L1 and the coil axis A2 of the second inductor L2 are orthogonal or substantially orthogonal to each other so as to prevent the first inductor L1 and the second inductor L2 from being inductively coupled to each other. Thus, unnecessary magnetic field coupling between the inductors L1 and L2 is able to be reduced or eliminated, and deterioration in the attenuation characteristics is able to be reduced or prevented.

Further, in the filter device 2A, the first inductor L1 and the second inductor L2 are respectively disposed beside the filter chip 40 so as to be adjacent to each other, and the third inductor L3 is incorporated into the multilayer substrate 60. With these configurations, it is possible to reduce the size of the filter device 2A.

While the filter devices 2 and 2A and the multiplexer 1 according to preferred embodiments of the present invention have been described above, the present invention is not limited to the above-described preferred embodiments. For example, structures in which the following modifications are applied to the above-described preferred embodiments may also be included in the present invention.

For example, in the preferred embodiments described above, the duplexer is used as an example of the multiplexer, but the present invention is not limited thereto. A multiplexer in which a plurality of transmission filters are bundled or a multiplexer in which a plurality of reception filters are bundled may be used.

Preferred embodiments of the present invention are widely applicable to communication apparatuses, such as a cellular phone and other suitable apparatuses, as a filter device and a multiplexer which may be applied to a multi-band and multi-mode frequency standards.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
a first terminal and a second terminal;
a ladder first filter provided on a first channel connecting the first terminal and the second terminal and including a series resonator and a parallel resonator;
a first inductor connected in parallel to the first channel between the first terminal and the first filter;
a second inductor provided in series in the first channel between the first filter and the second terminal; and
a third inductor provided in series in a channel connecting the parallel resonator and ground; wherein
the third inductor is incorporated in a multilayer substrate that includes a plurality of base layers;
the first filter is mounted on a main surface of the multilayer substrate and incorporated in a filter chip;
the first inductor and the second inductor are chip inductors including coil conductors, and are respectively mounted on the main surface of the multilayer substrate beside the filter chip so as to be adjacent to each other and such that coil axes of the first inductor and the second inductor are orthogonal or substantially orthogonal to each other;
the first inductor and the second inductor are mounted on the multilayer substrate such that one of the coil axes is orthogonal or substantially orthogonal to the main surface of the multilayer substrate; and
the third inductor is a coil conductor pattern and is incorporated in the multilayer substrate such that a coil axis of the third inductor is orthogonal or substantially orthogonal to the main surface of the multilayer substrate.

2. The filter device according to claim 1, wherein the plurality of base layers are ceramic base layers or resin base layers.

3. A multiplexer comprising:
the filter device according to claim 1;
a third terminal; and
a second filter provided on a second channel connecting the first terminal and the third terminal.

4. The multiplexer according to claim 3, wherein a coupling coefficient between one of the first inductor or the second inductor and the third inductor is equal to or greater than about 0.006 and equal to or less than about 0.042.

5. The multiplexer according to claim 3, wherein
the first filter includes another parallel resonator different from the parallel resonator connected to the third inductor;
a fourth inductor is provided in series in another channel connecting the another parallel resonator and ground; and
the fourth inductor is incorporated in the multilayer substrate.

6. The multiplexer according to claim 5, wherein
the first inductor and the second inductor are mounted on the multilayer substrate such that one of the coil axes is orthogonal or substantially orthogonal to the main surface of the multilayer substrate; and
the fourth inductor is a coil conductor pattern and is incorporated in the multilayer substrate such that a coil axis of the fourth inductor is orthogonal or substantially orthogonal to the main surface of the multilayer substrate.

7. The multiplexer according to claim 5, wherein a coupling coefficient between one of the first inductor or the second inductor and the fourth inductor is equal to or greater than about 0.006 and equal to or less than about 0.042.

8. The multiplexer according to claim 3, wherein the filter device is an unbalanced filter.

9. The multiplexer according to claim 3, wherein the filter device is a ladder filter.

10. The multiplexer according to claim 3, wherein the filter device and the second filter are commonly connected to each other at a connection point.

11. The multiplexer according to claim 3, wherein the second filter is a balanced filter.

12. The multiplexer according to claim 3, wherein the second filter includes an elastic wave resonator and longitudinally coupled resonator elastic wave filter portions.

13. The multiplexer according to claim 3, wherein the plurality of base layers are ceramic base layers or resin base layers.

14. A filter device comprising:
a first terminal and a second terminal;
a ladder first filter provided on a first channel connecting the first terminal and the second terminal and including a series resonator and a parallel resonator;
a first inductor connected in parallel to the first channel between the first terminal and the first filter;
a second inductor provided in series in the first channel between the first filter and the second terminal; and
a third inductor provided in series in a channel connecting the parallel resonator and ground; wherein
the third inductor is incorporated in a multilayer substrate that includes a plurality of base layers;
the first filter is mounted on a main surface of the multilayer substrate and incorporated in a filter chip;
the first inductor and the second inductor are chip inductors including coil conductors, and are respectively mounted on the main surface of the multilayer substrate beside the filter chip so as to be adjacent to each other and such that coil axes of the first inductor and the second inductor are orthogonal or substantially orthogonal to each other; and
a coupling coefficient between one of the first inductor or the second inductor and the third inductor is equal to or greater than about 0.006 and equal to or less than about 0.042.

15. A filter device comprising:
a first terminal and a second terminal;
a ladder first filter provided on a first channel connecting the first terminal and the second terminal and including a series resonator and a parallel resonator;
a first inductor connected in parallel to the first channel between the first terminal and the first filter;
a second inductor provided in series in the first channel between the first filter and the second terminal; and a third inductor provided in series in a channel connecting the parallel resonator and ground; wherein
the third inductor is incorporated in a multilayer substrate that includes a plurality of base layers;
the first filter is mounted on a main surface of the multilayer substrate and incorporated in a filter chip;
the first inductor and the second inductor are chip inductors including coil conductors, and are respectively mounted on the main surface of the multilayer substrate beside the filter chip so as to be adjacent to each other and such that coil axes of the first inductor and the second inductor are orthogonal or substantially orthogonal to each other;
the first filter includes another parallel resonator different from the parallel resonator connected to the third inductor;
a fourth inductor is provided in series in another channel connecting the another parallel resonator and ground; and
the fourth inductor is incorporated in the multilayer substrate.

16. The filter device according to claim 15, wherein
the first inductor and the second inductor are mounted on the multilayer substrate such that one of the coil axes is orthogonal or substantially orthogonal to the main surface of the multilayer substrate; and
the fourth inductor is a coil conductor pattern and is incorporated in the multilayer substrate such that a coil axis of the fourth inductor is orthogonal or substantially orthogonal to the main surface of the multilayer substrate.

17. The filter device according to claim 15, wherein a coupling coefficient between one of the first inductor or the second inductor and the fourth inductor is equal to or greater than about 0.006 and equal to or less than about 0.042.

* * * * *